(12) United States Patent
Miyoshi

(10) Patent No.: US 8,138,095 B2
(45) Date of Patent: Mar. 20, 2012

(54) METHOD OF SUBSTRATE TREATMENT, PROCESS FOR PRODUCING SEMICONDUCTOR DEVICE, SUBSTRATE TREATING APPARATUS, AND RECORDING MEDIUM

(75) Inventor: Hidenori Miyoshi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/282,654

(22) PCT Filed: Mar. 13, 2007

(86) PCT No.: PCT/JP2007/054976
§ 371 (c)(1),
(2), (4) Date: Sep. 12, 2008

(87) PCT Pub. No.: WO2007/111127
PCT Pub. Date: Oct. 4, 2007

(65) Prior Publication Data
US 2009/0075475 A1    Mar. 19, 2009

(30) Foreign Application Priority Data

Mar. 27, 2006 (JP) .................. 2006-086566

(51) Int. Cl.
*H01L 21/302* (2006.01)
*H01L 21/461* (2006.01)

(52) U.S. Cl. ........ 438/706; 438/653; 438/722; 438/720; 216/73; 216/78; 257/E21.585

(58) Field of Classification Search .................. 438/706, 438/720, 722; 216/73, 78
See application file for complete search history.

(56) References Cited

U.S. PATENT DOCUMENTS

| 5,939,334 A * | 8/1999 | Nguyen et al. ............. 438/689 |
| 6,399,552 B1 | 6/2002 | Lee et al. |
| 2005/0022909 A1 | 2/2005 | Wang et al. |

FOREIGN PATENT DOCUMENTS

| JP | 2000 226599 | 8/2000 |
| JP | 2001 271192 | 10/2001 |
| JP | 3373499 | 11/2002 |
| JP | 2003 243502 | 8/2003 |
| JP | 2004 300576 | 10/2004 |

OTHER PUBLICATIONS

"An XPS study of zinc oxide thin film growth on copper using zinc acetate as a precursor" Thin Solid Films, vol. 223, Issue 2, Feb. 15, 1993, pp. 341-347, Leong G. Mar, Peter Y. Timbrell, Robert N. Lamb.*
Machine Translation of JP2001-271192.*

* cited by examiner

*Primary Examiner* — Matthew Landau
*Assistant Examiner* — Sonya McCall Shepard
(74) *Attorney, Agent, or Firm* — Oblon, Spivak, McClelland, Maier & Neustadt, L.L.P.

(57) ABSTRACT

Substrate processing apparatus 100 includes supporting table 103 for not only supporting a target substrate W but also heating the target substrate W; processing chamber 101 having the supporting table disposed therein; and gas supply unit 102 for supplying a processing gas into the processing chamber 101. The processing gas includes organic acid metal complex or organic acid metal salt.

17 Claims, 6 Drawing Sheets

METHOD OF SUBSTRATE TREATMENT, PROCESS FOR PRODUCING SEMICONDUCTOR DEVICE, SUBSTRATE TREATING APPARATUS, AND RECORDING MEDIUM

FIELD OF THE INVENTION

The present invention relates to a method for manufacturing a semiconductor device using metal wiring.

BACKGROUND OF THE INVENTION

With the recent trend of high-performance semiconductor devices, Cu of low resistivity has been widely used as a wiring material of the semiconductor devices. In manufacturing a Cu multi-layered wiring structure by a damascene process, Cu wiring exposed through an interlayer insulating film may be oxidized because Cu can be easily oxidized. Therefore, a reducing gas such as $NH_3$ or $H_2$ has been used to remove the oxidized Cu by reduction.

However, in case of using $NH_3$ or $H_2$, the temperature of the Cu reduction process has to be high, e.g., 300° C. or higher, and so it is possible that the interlayer insulating film made of a so-called low-k material and formed around the Cu wiring can be most likely damaged. Due to this, low-temperature reduction of Cu by using a processing gas such as vaporized formic acid or acetic acid has been suggested.

However, monomers and dimmers exist together in the vaporized formic acid or acetic acid, which causes unstable reaction. For example, the ratio of the monomers and dimmers formed in the vaporized formic acid or acetic acid is significantly affected by a slight change of conditions, which may result in unstable Cu reduction. (see Japanese Patent No. 3373499).

SUMMARY OF THE INVENTION

In view of the above, therefore, an object of the present invention is to provide a novel and improved substrate processing apparatus, substrate processing method, a semiconductor device manufacturing method and storage medium storing the substrate processing method.

It is a specific object of the present invention to stably and efficiently remove an oxide film formed on metal wiring in the manufacturing process of the semiconductor device.

In accordance with a first aspect of the present invention, there is provided a substrate processing method for processing a target substrate including an insulating film and a metal layer. The method includes supplying organic acid metal complex or organic acid metal salt onto the target substrate while heating the target substrate.

In accordance with a second aspect of the present invention, there is provided a method for manufacturing a semiconductor device having metal wiring and an interlayer insulating film. The method includes supplying organic acid metal complex or organic acid metal salt onto a target substrate on which the metal wiring and the interlayer insulating film are formed while heating the target substrate.

In accordance with a third aspect of the present invention, there is provided a substrate processing apparatus including a supporting table for supporting and heating a target substrate; a processing chamber including the supporting table therein; and a gas supply unit for supplying a processing gas into the processing chamber. The processing gas includes organic acid metal complex or organic acid metal salt.

In accordance with a fourth aspect of the present invention, there is provided a storage medium storing a computer-executable program executing a substrate processing method by using a substrate processing apparatus which includes a supporting table for supporting and heating a target substrate; a processing chamber including the supporting table therein; and a gas supply unit for supplying a processing gas into the processing chamber. The substrate processing method includes supplying the processing gas including organic acid metal complex or organic acid metal salt onto the target substrate while heating the target substrate.

In accordance with the present invention, in the manufacturing process of the semiconductor device, metal contamination when the oxide film formed on the metal wiring is removed can be reduced.

Figure 1:
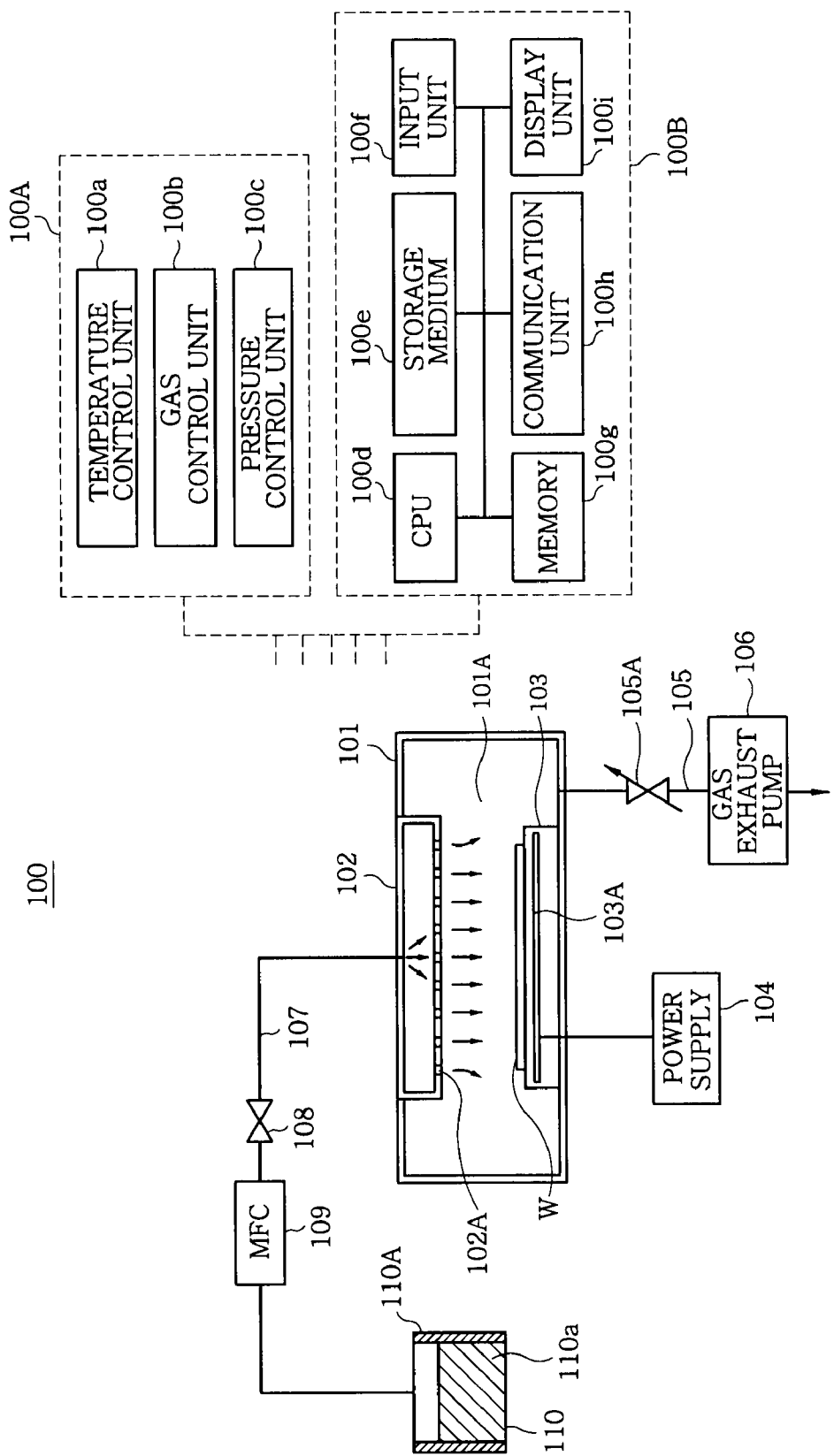
FIG. 1 shows a schematic diagram of a substrate processing apparatus in accordance with a first embodiment of the present invention.

DESCRIPTION OF REFERENCE NUMERALS 100, 100X substrate processing apparatus
100A controller
100$a$ temperature control unit
100$b$ gas control unit
100$c$ pressure control unit
100B computer
100$d$ CPU
100$e$ storage medium
100$f$ input unit
100$g$ memory
100$h$ communication unit
100$i$ display unit
101 processing chamber
101A processing space
102 gas supply unit
102A gas hole
102B reaction acceleration chamber
102$b$ heater
103 substrate supporting table
103A heater
104 power supply
105 gas exhaust line
105A pressure control valve
106 gas exhaust pump
107, 111 gas supply line
110 source supply unit
110$a$ source
110A heater
112 vapor generator
113, 117 gas line
108, 114, 118 valve
109, 115, 119 MFC
116, 120 gas supply source

DETAILED DESCRIPTION OF THE EMBODIMENTS

Hereinafter, embodiments of the present invention will be described.

The present invention is related to a substrate processing method for processing a target substrate on which an insulating film and a metal layer, e.g., Cu wiring, are formed. The method includes processes of supplying organic acid metal complex or organic acid metal salt onto the target substrate while heating the target substrate.

Organic acid metal complex or organic acid metal salt used in the substrate processing method of the present invention more stably removes Cu oxide film compare to formic acid or acetic acid which is conventionally used. For example, monomers and dimmers of formic acid or acetic acid are formed in a substrate processing, and their ratio is significantly affected by a slight change of conditions, which may result in unstable metal (Cu) reduction.

In the embodiment of the present invention, instead of using above-mentioned formic acid or acetic acid, organic acid metal complex or organic acid metal salt resulting in stable and efficient metal reduction is used.

Further, the substrate processing method of the present invention uses organic acid metal complex or organic acid metal salt which is less corrosive to metal. Therefore, corrosion of metal lines or processing chamber provided in the substrate processing apparatus is suppressed so that the substrate can be processed with reduced metal contamination.

Further, in addition to metal reduction, dehydration of the insulating film, i.e. an interlayer insulating film formed around the metal wiring, e.g., Cu wiring, can be performed by the processing gas for the metal reduction.

For example, in order to reduce wiring delay in the semiconductor device using metal wiring, it is preferable to use Cu to lower wiring resistance and a low-dielectric constant material referred to as a low-k material for the interlayer insulating film.

On the other hand, moisture is often included in the interlayer insulating film formed of a low-k material, which leads to deterioration of insulation property of the interlayer insulating film or increase in dielectric constant. Therefore, by using organic acid metal complex or organic acid metal salt in the substrate processing method of the present invention, dehydration of the interlayer insulating film as well as metal reduction can be performed.

Since the metal reduction and dehydration of the interlayer insulating film by using organic acid metal complex or organic acid metal salt can be performed at a low temperature of 300° C. or lower, the present invention may be used to manufacture semiconductor devices with an interlayer insulating film formed of a low-k material which is likely to be damaged at a high temperature.

Next, embodiments of the above-mentioned substrate processing method, the method for manufacturing the semiconductor device to which the substrate processing method is applied, the substrate processing apparatus used to perform the substrate processing method and a storage medium storing the substrate processing method will be described in detail with reference to the accompanying drawings.

First Embodiment

FIG. 1 shows a schematic diagram of an exemplary substrate processing apparatus in accordance with a first embodiment of the present invention. Referring to FIG. 1, the substrate processing apparatus 100 includes a processing chamber 101 defining a processing space 101A. A substrate supporting table 103 for supporting a target substrate W thereon is provided in the processing space 101A and a heater 103A for heating the target substrate W is buried in the substrate supporting table 103. The heater 103A is connected to a power supply 104 and heats the target substrate W to a predetermined temperature.

The processing space 101A is evacuated through a gas exhaust line 105 connected to the processing chamber 101 and it is maintained at a lower pressure. The gas exhaust line 105 is connected to a vacuum exhaust pump 106 via a pressure control valve 105A so that the processing space 101A can be maintained at a predetermined pressure.

Further, the processing chamber 101 is provided with a gas supply unit 102 having, e.g., a shower head structure, which faces the substrate supporting table 103. The gas supply unit 102 is connected to a gas supply line 107 through which a processing gas formed of the organic acid metal complex or organic acid metal salt is supplied.

The processing gas from the gas supply unit 102 is introduced into the processing space 101A through multiple gas holes 102A formed at the gas supply unit 102. The processing gas introduced in the processing space 101A reaches the target substrate W heated to a predetermined temperature by the heater 103A and, for example, removal of an oxide film of Cu wiring formed on the target substrate W, i.e. Cu reduction, or dehydration of an insulating film (interlayer insulating film) formed on the target substrate W is then performed.

A valve 108 and a mass flow controller (MFC) 109 are disposed on the gas supply line 107 connected to a source supply unit 110 for supplying a source material 110a formed of the organic acid metal complex or organic acid metal salt. The source supply unit 110 is provided with a heater 110A and the source material 11a is vaporized or sublimated when heated by the heater 110A. The vaporized or sublimated source material 110a, i.e. the processing gas is supplied to the processing space 101A via the gas supply line 107.

When the source material 110a is vaporized or sublimated or when the vaporized or sublimated source material (processing gas) 110a is supplied to the processing space 101A, the processing gas may be supplied to the processing space 101A along with a carrier gas such as Ar, $N_2$ or He. Alternatively, the source material may be vaporized by using a vaporizer employing so-called liquid injection.

Substrate processing operations of the substrate processing apparatus 100 are controlled by a controller 100A and the controller 100A is controlled by a program stored in a computer 100B. The wiring is not shown in the drawings.

The controller 100A includes a temperature control unit 100a, a gas control unit 100b and a pressure control unit 100c. The temperature control unit 100a controls the power supply 104 to control the temperature of the supporting table 103 and the temperature of the target substrate W heated by the supporting table 103.

The gas control unit 100b controls the opening/closing of the valve 108 and the flow rate of the MFC 109 to control the state of the processing gas supplied to the processing space 101A. Further, the pressure control unit 100c controls the gas exhaust pump 106 and the opening degree of the pressure control valve 105A so that the processing space 101A can be maintained at a predetermined pressure.

Since the controller 100A is controlled by the computer 100B, the substrate processing apparatus 100 is operated by the computer 100B. The computer 100B includes a CPU 100d, a storage medium 100e, an input unit 100f, a memory 100g, a communication unit 100h and a display unit 100i. For example, a program related to the substrate processing method is stored in the storage medium 100e and the substrate processing is performed according to the program. The program may be provided by the communication unit 100h or the input unit 100f.

Second Embodiment

Figure 2:
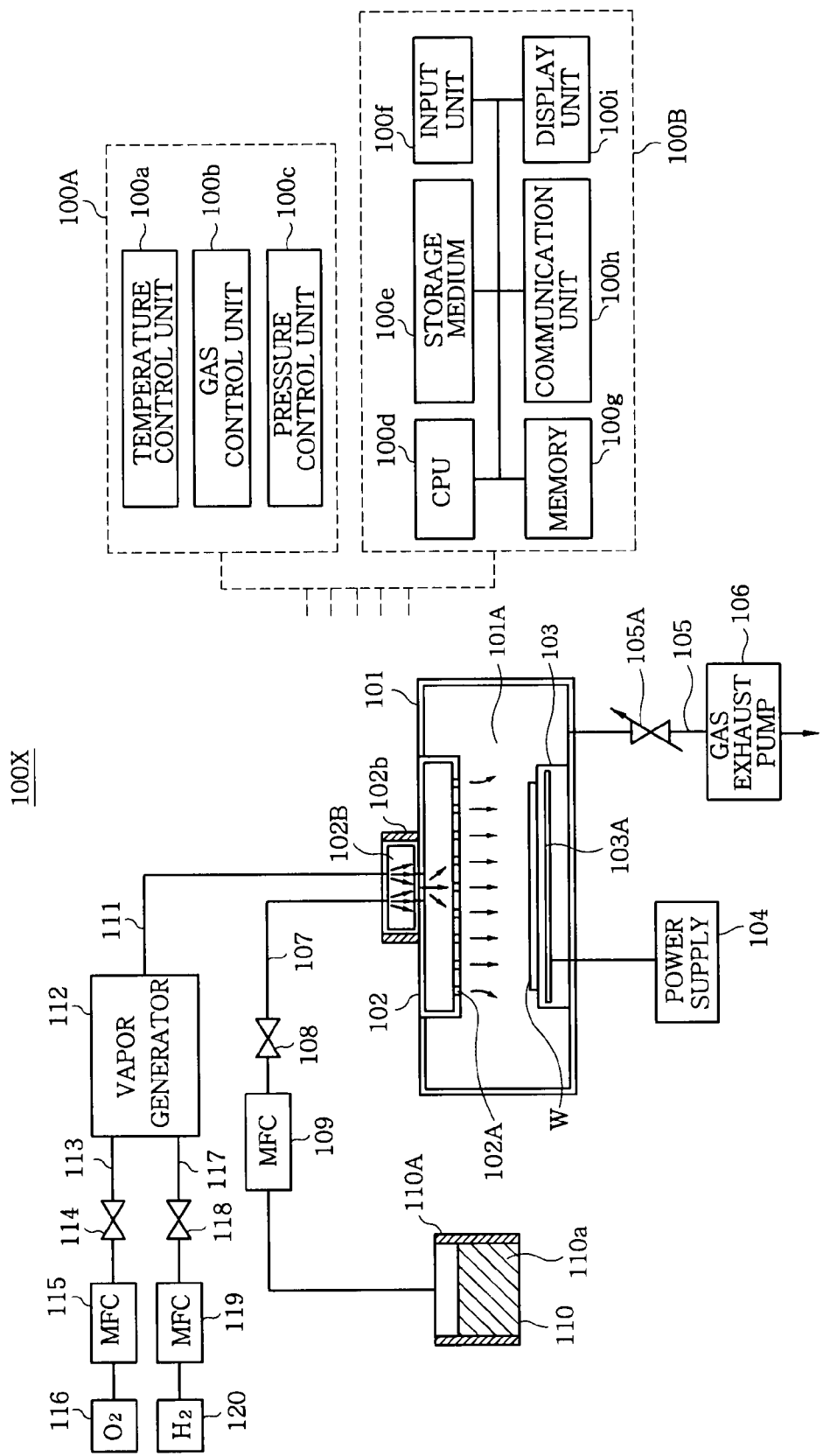
FIG. 2 shows a schematic diagram of a substrate processing apparatus in accordance with a second embodiment of the present invention.

The configuration of the substrate processing apparatus 100 of the first embodiment may be modified as follows. FIG. 2 shows a schematic diagram of a substrate processing apparatus 100X in accordance with a second embodiment of the present invention. Like reference numerals in the drawing will be given to parts identical to those described above and description thereof will be omitted. Further, the description given to the substrate processing apparatus 100 of the first embodiment is assumed to be applied to the unmentioned part.

As shown in FIG. 2, steam ($H_2O$) in addition to the organic acid metal complex or organic acid metal salt is supplied to the substrate processing apparatus 100X in the present embodiment. The substrate processing apparatus 100X is provided with a gas mixing unit (reaction acceleration chamber) 102B coupled to the gas supply unit 102 and steam ($H_2O$) is supplied from a vapor generator 112 to the gas mixing unit 102B.

Here, the vapor is supplied to the reaction acceleration chamber 102B installed outside the gas supply unit 102 via a gas supply line 111. Through the gas supply lines 107 and 111 connected to the reaction acceleration chamber 102B, organic acid metal complex or organic acid metal salt and $H_2O$ are introduced to be mixed in the reaction acceleration chamber 102B. The mixed organic acid metal complex or organic acid metal salt and $H_2O$ are supplied to the processing space 101A via the gas supply unit 102. Installed outside the reaction acceleration chamber 102B is a heater 102b for heating the mixed organic acid metal complex or organic acid metal salt and $H_2O$ to a predetermined temperature which may be higher than the temperature of the target substrate.

The gas supply line 111 is connected to the vapor generator 112. The vapor generator 112 produces vapor by using $O_2$ supplied through a gas line 113 and $H_2$ supplied through a gas line 117. Installed on the gas line 113 connected to an $O_2$ supply source 116 are a valve 114 and an MFC 115. Likewise, installed on the gas line 117 connected to a $H_2$ supply source 120 are a valve 118 and an MFC 119. The gas control unit 100b controls the opening/closing of the valves 114 and 118, the MFCs 115 and 119 and the vapor generator 112 to thereby control the flow of $H_2O$ supplied via the gas supply line 111.

By processing the target substrate by using the above-described substrate processing apparatus, $H_2O$ in addition to organic acid metal complex or organic acid metal salt is provided to the processing space 101A so that Cu reduction can be preferably made further stable.

Third Embodiment

Hereinafter, an exemplary method for manufacturing a semiconductor device by using the substrate processing apparatus 100 or 100X will be described with reference to FIGS. 3A to 3E.

Figure 3A:
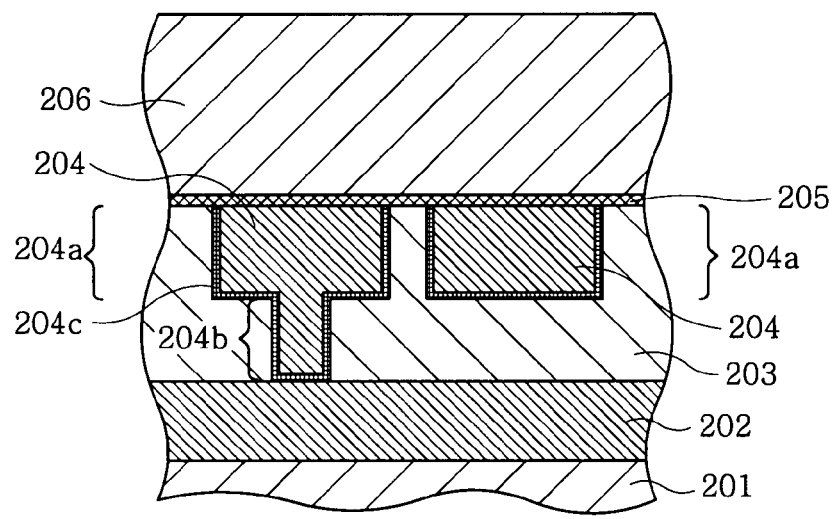
FIGS. 3A to 3E are drawings for describing a method for manufacturing a semiconductor device (substrate processing method) in accordance with a third embodiment of the present invention.

First, formed in the semiconductor device shown in FIG. 3A is an insulating film, e.g., a silicon oxide film 201 to cover devices such as MOS transistors (not shown) formed on a semiconductor substrate made of silicon, i.e. the target substrate W. Further, formed on the silicon oxide film 201 are a wiring layer made (not shown) of, e.g., tungsten W and electrically connected to corresponding elements and a wiring layer 202 made of, e.g., Cu connected thereto.

A first insulating layer (an interlayer insulating film) 203 is formed on the silicon oxide film 201 to cover the wiring layer 202. A groove portion 204a and a hole portion 204b are formed in the first insulating layer 203. A wiring portion 204 made of Cu and having trench wiring and via wiring is formed in the groove portion 204a and the hole portion 204b, and the wiring portion 204 is electrically connected to the wiring layer 202.

A Cu diffusion barrier film 204c is formed between the first insulating film 203 and the wiring portion 204. The Cu diffusion barrier film 204c prevents Cu of the wiring portion 204 from diffusing to the first insulating layer 203. In addition, an insulating film (Cu diffusion barrier layer) 205 and a second insulating layer (interlayer insulating film) 206 are formed to cover upper parts of the wiring portion 204 and the first insulating layer 203.

Next, the method for manufacturing a semiconductor device by forming Cu wiring by applying the substrate processing method described above to the second insulating layer 206 will be described. The wiring portion 204 may also be formed by using the method as follows.

Figure 3B:
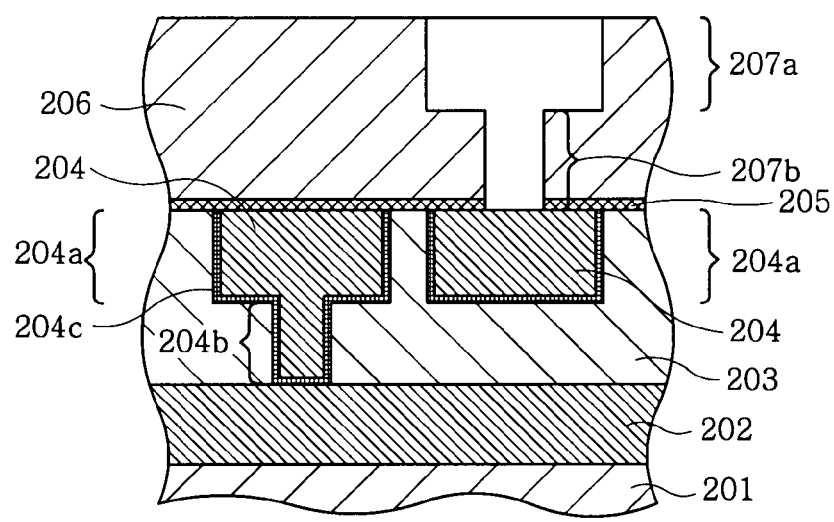

In the process shown in FIG. 3B, a groove portion 207a and a hole portion 207b are formed in the second insulating layer 206 by a dry etching method, the hole portion 207b penetrating the insulating layer 205. Therefore, part of the wiring portion 204 made of Cu is exposed through an opening formed in the second insulating layer 206. An oxide film (not shown) is formed on the exposed top surface of the wiring portion 204.

Figure 3C:
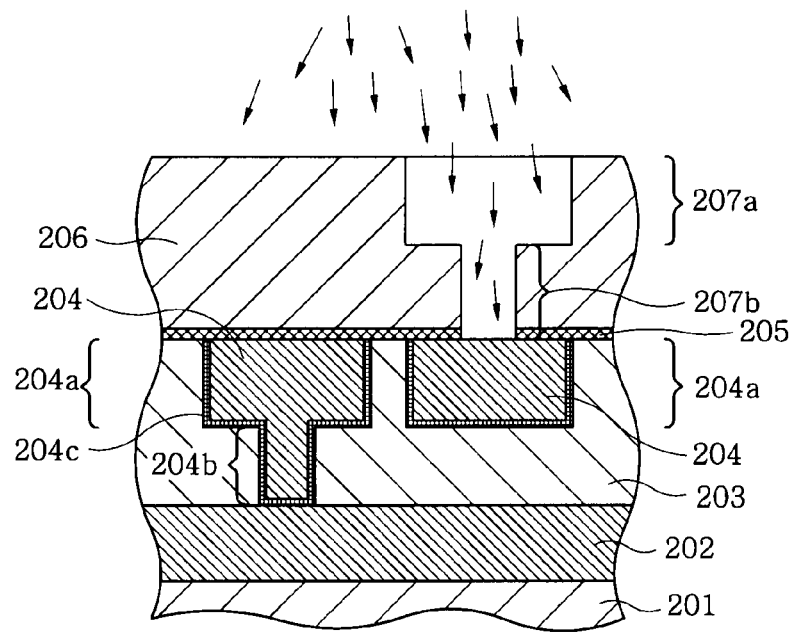

In the process shown in FIG. 3C, removal of the oxide film on the exposed Cu wiring, i.e. the Cu reduction is performed by the above-described substrate processing method by using the substrate processing apparatus 100 or 100X. At this time, a vaporized or sublimated organic acid metal complex or organic acid metal salt is supplied onto the target substrate and at the same time the target substrate is heated, thereby removing the Cu oxide film.

The target substrate can be processed at a low temperature of, e.g., 300° C. or lower, compared to the reduction process using $H_2$ or $NH_3$. Further, since the substrate processing can be performed at a low temperature of 300° C. or lower, the present embodiment is useful especially when the interlayer insulating film is formed of a low-k (low dielectric constant) material that can be most likely to be damaged by heat.

However, if the temperature of the target substrate is too low, reduction reaction does not proceed fast enough, so a temperature of 100° C. or higher is preferable. That is, the temperature of the target substrate in the range from 100 to 300° C. is preferable.

As described above, dehydration of the interlayer insulating film can be performed at the same time as the Cu reduction is performed in this process. The dehydration of the second insulating layer 206 is accelerated by heating the organic acid metal complex or organic acid metal salt supplied to the second insulating layer 206 so that electrical characteristics of the second insulating layer 206 can be improved thereby, for example, decreasing dielectric constant, while improving withstanding voltage.

Such improved electrical characteristics by dehydration can be obtained when the second insulating layer 206 is formed of a silicon oxide ($SiO_2$) film. The electrical characteristics are even more improved if the second insulating layer 206 is formed of a low-k material of high absorption. For example, a porous film or a film including fluorine can be used as the low dielectric constant material, i.e. the interlayer insulating film.

$H_2O$ may be supplied to the target substrate by employing the substrate processing apparatus 100X in this process so that the Cu oxide film can be removed stably and efficiently. In this case, the amount of $H_2O$ is appropriately adjusted depending on dehydration effect of the interlayer insulating film. That is, it is preferable that little $H_2O$ or no $H_2O$ is supplied if absorption of the interlayer insulating film is relatively high and more $H_2O$ is supplied for stable Cu reduction if absorption of the interlayer insulating film is relatively low.

The above-described metal salt or metal complex used in the present embodiment are indicated as $M_a(RCOO)_b$ where M is metal, a and b are natural numbers, and R is a hydrogen atom, hydrocarbon or a functional group wherein at least one of hydrogen atoms of hydrocarbon is substituted with halogen atom. To be specific, alkyl, alkenyl, alkynyl or aryl may be used as hydrocarbon. The halogen refers to fluorine, chlorine, bromide or iodine.

As a metal element forming the organic acid metal complex or organic acid metal salt, for example, titanium, ruthenium, Cu (copper), cobalt, aluminum or the like may be used. Further, carboxylic acid, such as formic acid, acetic acid, propion acid, butryc acid, acetic-formic acid and valeric acid, may be used as organic acid forming the organic acid metal complex or organic acid metal salt. That is, for example, the organic acid metal complex or organic acid metal salt is formed by mixing corresponding metal and organic acid.

For example, formic acid titanium, formic acid ruthenium, formic acid copper, formic acid silicon, formic acid cobalt, formic acid aluminum or the like may be used as the organic acid metal complex or organic acid metal salt when organic acid is formic acid. Similarly, acetic acid titanium, acetic acid ruthenium, acetic acid copper, acetic acid silicon, acetic acid cobalt, acetic acid aluminum or the like may be used as the organic acid metal complex or organic acid metal salt when organic acid is acetic acid.

Referring to FIG. 3C, the processing conditions are as follows: the flow rate of the organic acid metal complex or organic acid metal salt is in a range from 1 to 1000 sccm; the pressure of the processing space 101A ranges from 1 to 1000 Pa; the temperature of the target substrate is in a range of from 100 to 300° C.; and the processing time ranges from 1 to 180 seconds. When vapor is used, its flow rate ranging from 1 to 1000 sccm is preferable. It is preferable that the temperature of the reaction acceleration chamber 102B is higher than that of the target substrate.

Figure 3D:
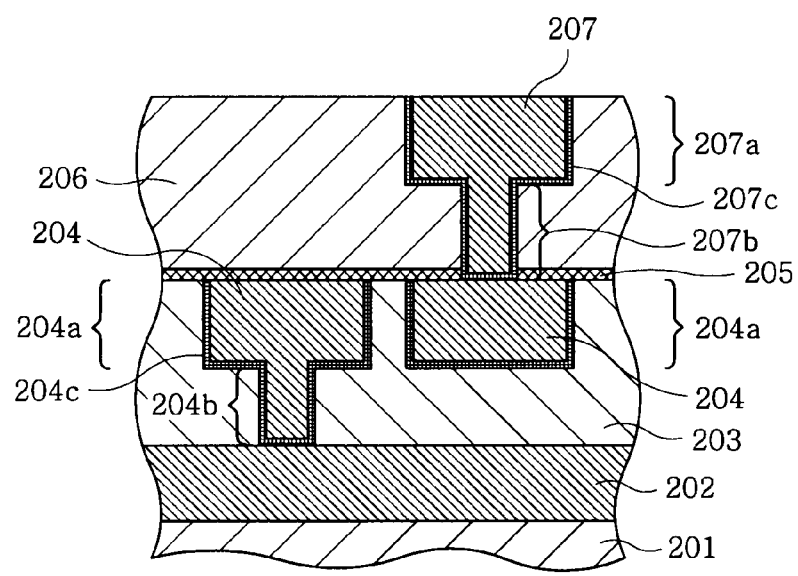

In the process shown in FIG. 3D, a Cu diffusion barrier film 207c is formed on the inner wall surfaces of the groove portion 207a and hole portion 207b formed in the second insulating film 206 and on the exposed surface of the wiring portion 204. The Cu diffusion barrier film 207c is formed of a high-melting point metal film or a nitride film thereof or their laminated film. For example, the Cu diffusion barrier film 207c may be formed of a Ta/TaN film, a WN film or a TiN film by a sputtering, CVD method or the like. Besides, the Cu diffusion barrier film 207c may also be formed by a so-called ALD method.

Further, the metal element forming the organic acid metal complex or organic acid metal salt, which is used as the processing gas in the process shown in FIG. 3C, is preferably same as a metal element forming the Cu diffusion barrier film 207c formed in the process shown in FIG. 3D. In this case, since the process of FIG. 4 in which the film including the corresponding metal element is formed is performed after the process of FIG. 3C, contamination of the corresponding metal element can be avoided.

For example, when the Cu diffusion barrier film 207c is formed with TiN film and the like, Ti is preferably used as the organic acid metal complex or organic acid metal salt in the process shown in FIG. 3C. In this case, for example, the processing gas is preferably formic acid titanium or acetic acid titanium.

Figure 3E:
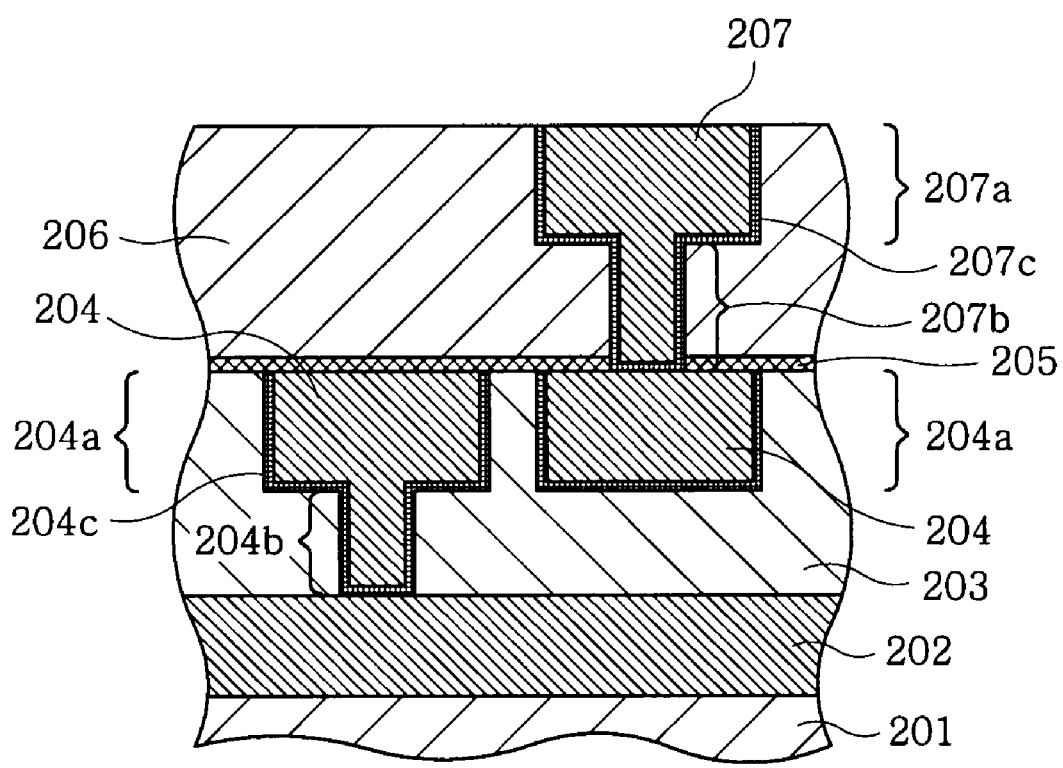

Next, in the process shown in FIG. 3E, a wiring portion 207 made of Cu is formed on the Cu diffusion barrier film 207c formed in the groove portion 207a and hole portion 207b. For example, a seed layer made of Cu is formed by a sputtering or CVD method and then the wiring portion 207 is formed by Cu electroplating. The wiring portion 207 may be formed by a CVD or ALD method as well.

After the wiring portion 207 is formed, the substrate surface is flattened by chemical mechanical polishing (CMP).

It is possible to fabricate a semiconductor device of a multilayer wiring structure by forming a $2+n^{th}$ insulating layer (herein, n is a natural number) on the top of the second insulating layer after this process and then forming a wiring portion made of Cu thereon in accordance with the above-described method.

Although the present embodiment has been described with respect to the Cu multilayer wiring structure formed by a dual damascene method, the above-described method can also be used to form a Cu multilayer wiring structure formed by a single damascene method.

Further, in the present embodiment although the Cu wiring has been used as metal wiring formed in the insulating layer, the present invention is not limited thereto. For example, the embodiment may also be applied to metal wiring made of Ag, W, Co, Ru, Ti, Ta or the like other than Cu.

Figure 4:
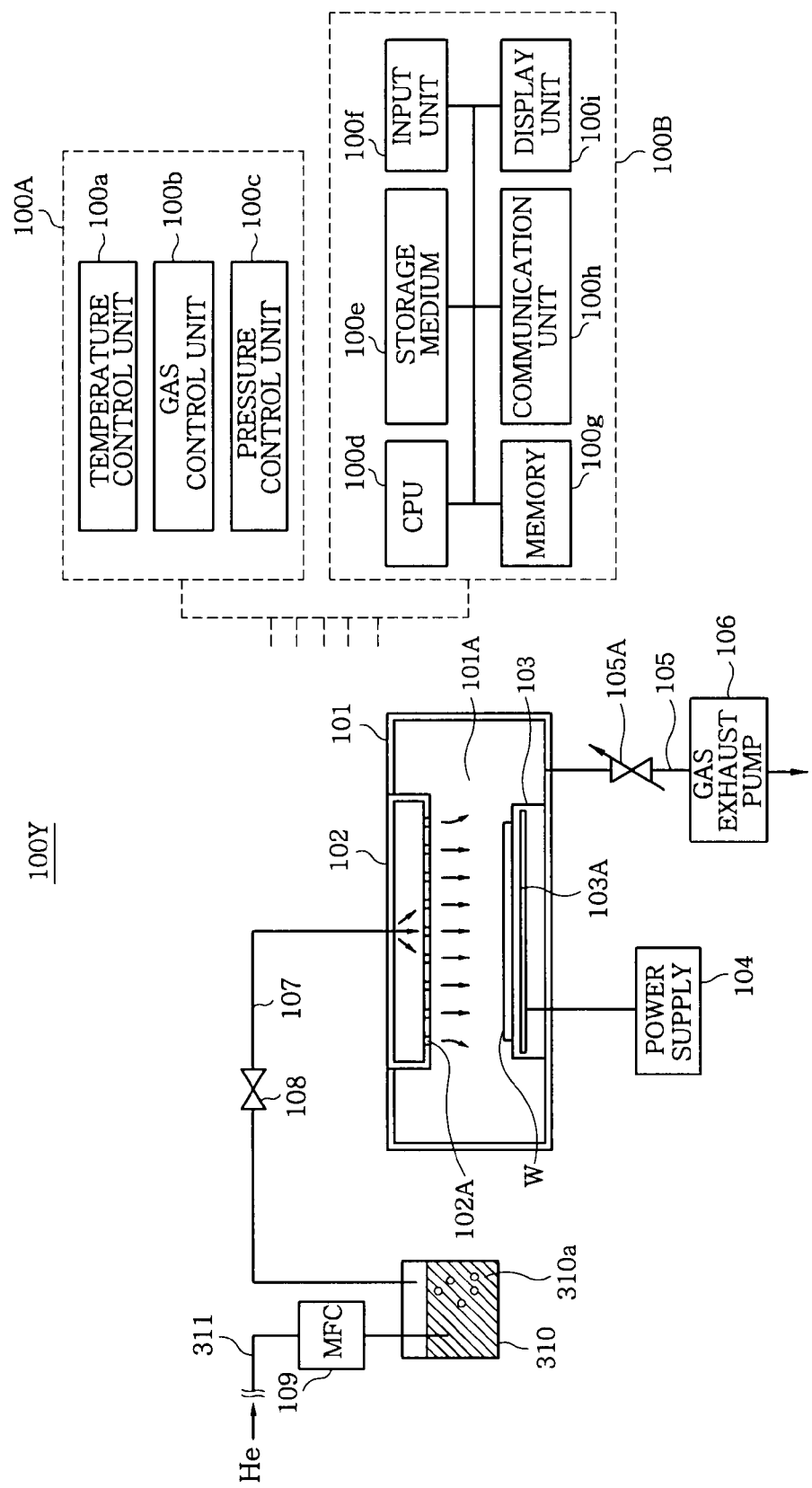
FIG. 4 illustrates a modified example of the substrate processing apparatus shown in FIG. 1.

The substrate processing apparatus of the present invention is not limited to the substrate processing apparatuses described in the first and second embodiments and various changes and modifications may be made. As a modified example of the substrate processing apparatus 100 described in the first embodiment, a substrate processing apparatus 100Y is shown in FIG. 4. Herein, like reference numerals will be given to parts identical to those described above and description thereof will be omitted.

Referring to FIG. 4, the substrate processing apparatus 100Y is provided with a source supply unit 310 instead of the source supply unit 110 provided in the substrate processing apparatus 100. The source material 110a is vaporized or sublimated by a so-called bubbling method in the source supply unit 310 and then supplied to the processing space 101A via the gas supply line 107.

An inert gas such as He serving as a carrier gas is supplied to the source supply unit 310 through a gas line 311 and the vaporized or sublimated source material is supplied along with the carrier gas to the processing chamber.

As described above, in accordance with the method for manufacturing a semiconductor device of the present embodiment, an oxide film formed on the Cu wiring can be removed stably and efficiently with less metal contamination. Further, dehydration of the interlayer insulating film as well as removal of the Cu oxide film can be performed. Therefore, removal of the Cu oxide film and dehydration of the interlayer insulating film which have been conventionally performed in separate processes can be performed together, so that manufacturing processes of the semiconductor device can be simplified.

Further, the substrate processing method (the process shown in FIG. 3C) described in the aforementioned embodiment may be applied in other applications. For example, it can be applied in pre-processing of capacitor metal (electroless plating), pre-processing of capacitor insulating film or pre-processing for forming Cu by plating or CVD (Chemical Vapor Deposition). In this case, suitable metal element forming the organic acid metal complex or organic acid metal salt needs to be chosen to reduce metal contamination.

Although the above embodiments have been described with respect to removal of the oxide film of the metal layer and dehydration of the interlayer insulating film performed at the same time, the present invention is not limited thereto. For example, dehydration of the interlayer insulating film can be performed without removing the oxide film of the metal layer. In this case, the processing gas may be formed of the metal salt or metal complex described above. Here, the substrate processing method and apparatus as described in the embodiments may be applied.

While the invention has been shown and described with respect to the embodiments, it will be understood by those skilled in the art that various changes and modifications may be made without departing from the scope of the invention as defined in the claims.

For example, although the substrate processing method of the present invention has been applied to removal of a Cu surface oxide film of the underlying wiring exposed through an opening formed by etching the insulating layer in the above-described embodiments, it may also be applied to removal of a Cu surface oxide film in various other processes.

For example, the present invention may be used after a seed layer or a wiring layer is formed or after CMP is performed.

INDUSTRIAL APPLICABILITY

In accordance with the present invention, in the manufacturing process of semiconductor devices, metal contamination when an oxide film formed on metal wiring is removed can be reduced.

The present international application claims priority to Japanese Patent Application No. 2006-086566, field on Mar. 27, 2006, the entire contents of which are incorporated herein by reference.

What is claimed is:

1. A substrate processing method for processing a target substrate including a low-K dielectric insulating film and a metal layer, the method comprising:
   forming an opening in the low-K dielectric insulating film to expose the metal layer;
   supplying a vaporized or sublimated organic acid metal complex or organic acid metal salt onto the target substrate while heating the target substrate; and
   with the vaporized or sublimated organic acid metal complex or organic acid metal salt, denuding an oxide film on the metal layer exposed in the low-K dielectric insulating film and dehydrating the low-K dielectric insulating film.

2. The substrate processing method of claim 1, wherein the metal layer is made of Cu.

3. The substrate processing method of claim 1, wherein the oxide film formed on the metal layer is removed by said supplying.

4. The substrate processing method of claim 1, wherein the insulating film is either a porous film or a film including fluorine.

5. The substrate processing method of claim 1, wherein $H_2O$ vapor is supplied along with the vaporized or sublimated organic acid metal complex or organic acid metal salt onto the target substrate.

6. The substrate processing method of claim 1, further comprising forming a film including a metal element contained in the organic acid metal complex or organic acid metal salt after the supplying of the vaporized or sublimated organic acid metal complex or organic acid metal salt.

7. The substrate processing method of claim 1, wherein said organic acid metal complex or organic acid metal salt is selected from the group consisting of formic acid titanium, formic acid ruthenium, formic acid copper, formic acid silicon, formic acid cobalt, formic acid aluminum, acetic acid titanium, acetic acid ruthenium, acetic acid copper, acetic acid silicon, acetic acid cobalt, and acetic acid aluminum.

8. The substrate processing method of claim 2, wherein the processing temperature of the target substrate falls in a range from 100 to 300° C. to prevent substrate damage.

9. A method for manufacturing a semiconductor device having metal wiring and a low-K dielectric interlayer insulating film, the method comprising:
   forming an opening in the low-K dielectric insulating film to expose the metal wiring;
   supplying a vaporized or sublimated organic acid metal complex or organic acid metal salt onto a target substrate on which the metal wiring and the interlayer insulating film are formed while heating the target substrate; and
   with the vaporized or sublimated organic acid metal complex or organic acid metal salt, denuding an oxide film on the metal wiring exposed in the low-K dielectric insulating film and dehydrating the low-K dielectric interlayer insulating film.

10. The method of claim 9, wherein the metal wiring is made of Cu.

11. The method of claim 9, wherein an oxide film formed on the metal wiring is removed by said supplying.

12. The method of claim 9, wherein the interlayer insulating film is either a porous film or a film including fluorine.

13. The method of claim 9, wherein $H_2O$ vapor is supplied along with the vaporized or sublimated organic acid metal complex or organic acid metal salt onto the target substrate.

14. The method of claim 9, further comprising forming a film including a metal element contained in the organic acid metal complex or organic acid metal salt after the supplying of the vaporized or sublimated organic acid metal complex or organic acid metal salt.

15. The method of claim 9, wherein said organic acid metal complex or organic acid metal salt is selected from the group consisting of formic acid titanium, formic acid ruthenium, formic acid copper, formic acid silicon, formic acid cobalt, formic acid aluminum, acetic acid titanium, acetic acid ruthenium, acetic acid copper, acetic acid silicon, acetic acid cobalt, and acetic acid aluminum.

16. The method of claim 10, wherein the temperature of the target substrate falls in a range from 100 to 300° C. to prevent substrate damage.

17. The method of claim 14, wherein the film including the metal element is a Cu diffusion barrier film.

* * * * *